(12) United States Patent
Phillips et al.

(10) Patent No.: US 8,786,068 B1
(45) Date of Patent: Jul. 22, 2014

(54) PACKAGING OF ELECTRONIC CIRCUITRY

(75) Inventors: Timothy A. Phillips, Hope, RI (US);
Danny Clavette, Greene, RI (US);
EungSan Cho, Torrance, CA (US);
Chuan Cheah, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 184 days.

(21) Appl. No.: 13/308,052

(22) Filed: Nov. 30, 2011

Related U.S. Application Data

(60) Provisional application No. 61/504,678, filed on Jul. 5, 2011.

(51) Int. Cl.
*H01L 23/495* (2006.01)

(52) U.S. Cl.
USPC .... 257/686; 257/666; 257/777; 257/E23.031; 438/106; 438/123; 438/124; 438/127

(58) Field of Classification Search
USPC .......................................................... 257/666
See application file for complete search history.

(56) References Cited

U.S. PATENT DOCUMENTS

| | | | |
|---|---|---|---|
| 6,337,510 B1* | 1/2002 | Chun-Jen et al. | 257/666 |
| 6,525,411 B1* | 2/2003 | Lee | 257/678 |
| 2004/0108580 A1* | 6/2004 | Tan et al. | 257/678 |
| 2005/0173783 A1* | 8/2005 | Chow et al. | 257/666 |
| 2007/0111374 A1* | 5/2007 | Islam et al. | 438/106 |

* cited by examiner

*Primary Examiner* — Victor A Mandala
*Assistant Examiner* — William Harriston
(74) *Attorney, Agent, or Firm* — Chapin IP Law, LLC

(57) ABSTRACT

A circuit package includes: electronic circuitry, electrically conductive material forming multiple leads, and multiple connections between the electronic circuitry and the multiple leads. A portion of the electrically conductive material associated with the multiple leads (e.g., low impedance leads supporting high current throughput) is removed to accommodate placement of the electronic circuitry. Each of the multiple leads can support high current. The multiple connections between the multiple leads provide connectivity between circuit nodes on the electronic circuitry and pads disposed on a planar surface of the electronic circuit package.

20 Claims, 16 Drawing Sheets

SIDE VIEW

PACKAGING OF ELECTRONIC CIRCUITRY

RELATED APPLICATIONS

This application is related to and claims the benefit of earlier filed U.S. Provisional Patent Application Ser. No. 61/504,678 entitled "HALF-ETCH LEAD FRAME ON TOP OF MONOLITHIC DIE,", filed on Jul. 5, 2011, the entire teachings of which are incorporated herein by this reference.

BACKGROUND

Conventional surface-mount technology (SMT) provides a way of interconnecting electronic circuit components with each other. For example, according to such technology, electronic devices can be specifically packaged for subsequent mounting directly on a respective surface of a printed circuit board. Because of the advantages associated with surface mount technology such as smaller part size, surface mount technology has, to a large extent, replaced so-called through-hole technology in which wire leads of components are fitted and soldered into holes of a printed circuit board to provide connectivity.

Surface mount devices can be packaged according to a variety of different styles. For example, a surface mount device can have relatively small leads or no leads extending from the package at all. Because a surface mount device has relatively small leads or no leads at all, a surface mount device is usually smaller than its through-hole (e.g., pin-based) counterpart. The surface mount device may have short pins or leads of various styles, flat contacts, a matrix of solder balls (such as Ball Grid Arrays), or terminations on the body of the component.

According to a conventional application, surface mount devices can include internal bond wires connecting nodes of an integrated circuit to pads of the surface mount device. The pads of the surface mount device can then be connected to a respective circuit board.

As an alternative to fabricating an integrated circuitry device into an electronic circuit package, the integrated circuit device can be mounted directly to a circuit board. For example, a backside surface of a semiconductor device can be mounted to a printed circuit board. The exposed top surface of the semiconductor device can include circuit nodes. Bond wires between the nodes on the semiconductor device and the printed circuit board connect the semiconductor device to the printed circuit board.

BRIEF DESCRIPTION

Conventional applications such as those as discussed above can suffer from a number of deficiencies. For example, as mentioned, bond wires are typically used to provide connectivity between a semiconductor device and another resource. In certain cases, although bond wire technology is somewhat reliable and relatively inexpensive, use of bond wires in high current applications is often undesirable since bond wires typically do not support high current. Accordingly, devices using bond wires to provide conductive paths are prone to failure in high current applications.

Embodiments herein deviate with respect to conventional applications. For example, embodiments herein include novel circuit packaging for applications requiring high current throughput and high thermal heat sinking capabilities.

More specifically, one embodiment herein includes a novel electronic circuit package. The electronic circuit package includes: electronic circuitry, electrically conductive material forming multiple leads, and multiple connections between the electronic circuitry and the multiple leads. In one embodiment, a portion of the electrically conductive material associated with the multiple leads (e.g., low impedance leads supporting high current throughput) is removed to accommodate placement of the electronic circuitry. Each of the multiple leads can support high current. The multiple leads provide low impedance connectivity between circuit nodes on the electronic circuitry and pads disposed on a planar surface of the electronic circuit package.

In accordance with another embodiment, an electronic circuit package comprises a semiconductor device, a set of conductive elements, and a set of planar leads. The semiconductor device has a substantially planar surface facing in a first direction. The substantially planar surface includes multiple circuit nodes. The set of conductive elements are disposed adjacent (e.g., at a periphery) with respect to the semiconductor device. The set of planar leads connect the multiple circuit nodes on the semiconductor device to planar surfaces of the conductive elements.

Embodiments herein further include a method of fabricating an electronic circuit package. For example, one embodiment herein includes steps of receiving a lead frame including lead material; removing a portion of lead material from the lead frame to accommodate a semiconductor device; and electrically connecting the multiple leads of the lead frame to nodes of the semiconductor device.

Another method embodiment includes creating multiple independent leads from a length of conductive material. For example, one embodiment herein includes receiving a lead frame including a length of conductive material; producing a notch on a surface of the length of conductive material; applying a layer of insulative material to the surface of the conductive material including the notch; and removing a portion of material from the length of conductive material on the length of conductive material opposite the notch to create at least two leads from the length of conductive material.

Another method embodiment includes fabricating an electronic circuit package. In accordance with such an embodiment, steps of fabricating the electronic circuit package includes: receiving electronic circuitry, the electronic circuitry having a substantially planar surface including multiple circuit nodes; disposing a facing of the planar surface including the multiple circuit nodes to point in a first direction; disposing a set of conductive elements adjacent to the electronic circuitry; and utilizing a set of planar leads to connect the multiple circuit nodes on the electronic circuitry to planar surfaces of the conductive elements.

These and other more specific embodiments are disclosed in more detail below.

As discussed herein, techniques herein are well suited for use in different electronic circuit package applications such as switching power supplies, voltage regulators, low voltage processors, buck converters, boost regulators, buck-boost regulators, electronic circuit packaging in general, etc. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details, summary, and/or possible perspectives (permutations) of the invention(s), the reader is directed to the Detailed Description section and corresponding figures, which includes a further summary of embodiments.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

As discussed above, use of conventional bond wires typically do not support high current and therefore are not suitable for high current applications. Bond wires also typically do not provide adequate heat sink capabilities. In contrast to conventional bond wires, embodiments herein provide electrically and thermally conductive paths (e.g., leads) capable of safely conveying, for example, up to tens, hundreds, or more amperes of current and heat from electronic circuitry in an electronic circuit package to a substrate such as a printed circuit board on which the electronic circuit package is mounted.

Figure 1:
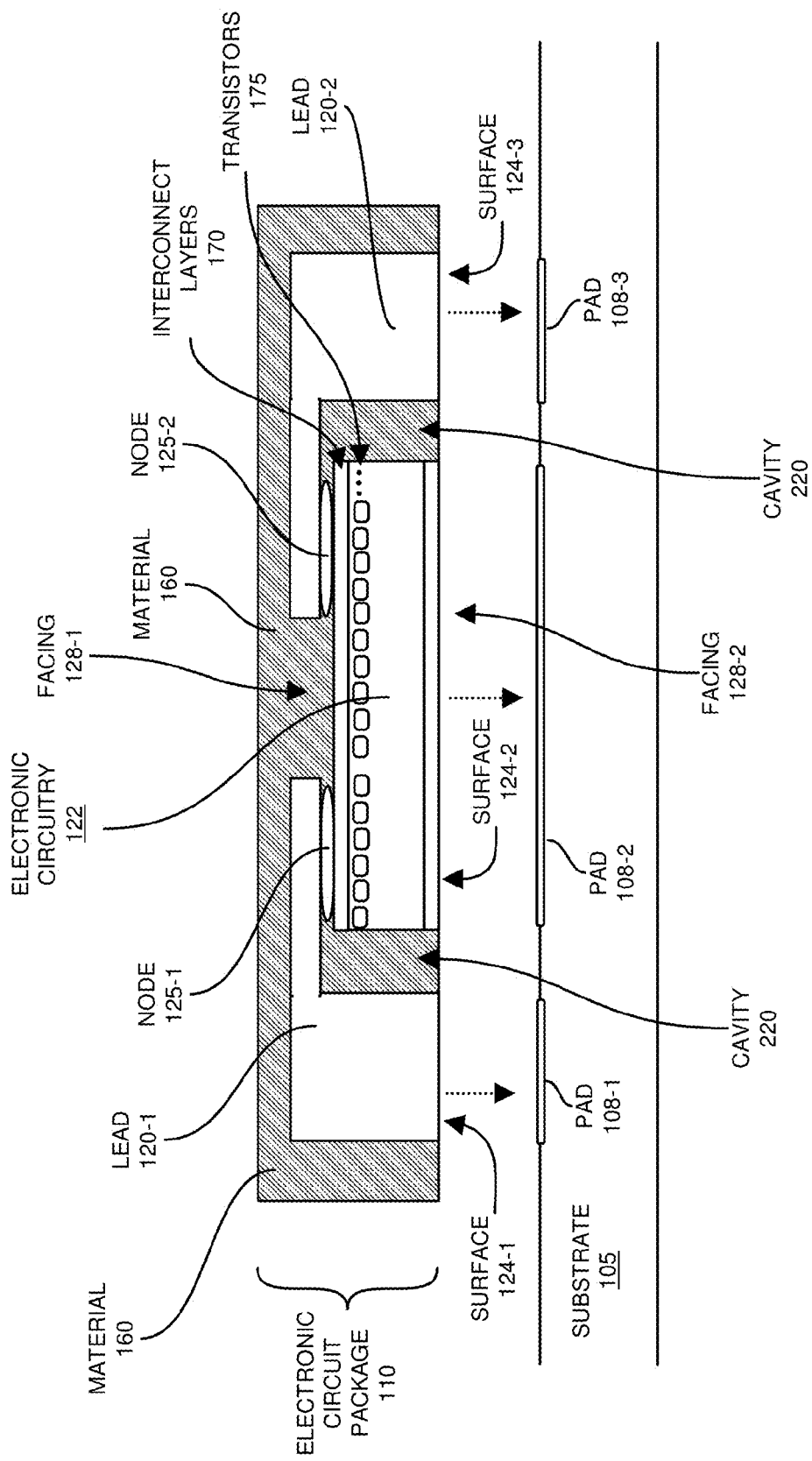
FIG. 1 is an example side view diagram of an electronic circuit package according to embodiments herein.

More specifically, FIG. 1 is an example side view of an electronic circuit package according to embodiments herein.

In one embodiment, the electronic circuit package 110 includes electronic circuitry 122, one or more leads 120 (e.g., lead 120-1, lead 120-2, . . . ) forming at least a portion of cavity 220, and multiple connections (e.g., solder, welds, etc.) between respective leads 120 and nodes 125 (e.g., node 125-1, node 125-2, etc.).

In one embodiment, the electronic circuitry 122 is a so-called bump die; in such an embodiment, the nodes 125 on the bump die are made of a material such as solder.

The electronic circuitry 122 can be any suitable circuit such as a single semiconductor chip, a monolithic circuit, interconnection of one or more circuits, discrete components, etc. By way of non-limiting example, in one embodiment, the electronic circuitry 122 can include all or a portion of power supply circuitry as discussed later in this specification. For example, in one embodiment, the electronic circuitry 122 is a semiconductor device including at least a portion of power supply switching circuitry, controller circuitry, etc.

The combination of leads 120, electronic circuitry 122, etc., can be encapsulated with material 160. Material 160 can be a non-electrically conductive material or insulative material (e.g., electrically non-conductive material, thermally low-conductive material, etc.) such as plastic encapsulating an assembly including the electronic circuitry 122, the multiple leads 125, etc. The material 160 protects the leads 120 and/or electronic circuitry 122 from damage.

In an example embodiment, the electronic circuitry 122 is a semiconductor device including one or more transistors 175. Interconnection of the transistors 175 via interconnect layer 170 provides functionality such as control and/or switching in a power supply application. As an example, the interconnect layer 170 can connect at least a portion of the multiple transistors 175 in parallel (e.g., connect gate nodes together, connect drain nodes together, connect source nodes together). The common gate can be connected to a first node 125 of electronic circuitry 122; the common source can be connected to a second node 125 of electronic circuitry 122; the common drain can be connected to a third node 125 of electronic circuitry 122; and so on.

Facing 128-1 (e.g., a topside) of electronic circuitry 122 includes multiple circuit nodes 125. Interconnect layers 170 in the electronic circuitry 122 provide connectivity amongst the transistors 175 up to nodes 125 exposed on facing 128-1 of the electronic circuitry 122.

In one embodiment, the circuit nodes 125 disposed on the facing 128-1 (e.g., planar facing) of the electronic circuitry 122 face a substantially opposite direction than a facing 128-2 (e.g., backside or bottom side planar facing) of the electronic circuit package 110.

For example, in accordance with FIG. 1, facing 128-1 points in an upward direction; facing 128-2 points in a downward direction. Accordingly, one embodiment herein includes a an electronic circuit package 110 in which each of the multiple leads 120 extends from a respective node 125 disposed on a surface of the electronic circuitry 122 to a respective pad (e.g., surface 124 formed via a layer of material such as metal) disposed on a bottom surface of the electronic circuit package. The facing 128-1 or surface of the electronic circuitry 122 faces a substantially opposite direction than the mounting surface (e.g., facing 128-2) or bottom side of the electronic circuit package 110.

In accordance with further embodiments, each of the multiple leads 120 can include a planar surface to electrically connect a respective lead to a corresponding circuit node on the electronic circuitry. For example, the surface of the lead 120-1 in contact with the node 125-1 can be a planar surface pointing (downward) in a same direction as facing 128-2. That is, the planar surface at axial ends of each lead frame faces a substantially same direction as the pads (e.g., surfaces 124) disposed on a bottom surface of the electronic circuit package 110. As mentioned, the circuit nodes 125 of the planar facing of the electronic circuitry 122 can be configured to face a substantially opposite direction than the planar surface at axial ends of each lead that connects to a respective node 125. A connection between such surfaces provides connectivity between a respective lead and node.

Note that, depending on the embodiment, transistors 170 can be fabricated into one or both facings of the electronic circuitry 122. As mentioned, the connections between axial end of leads 120 and respective nodes 125 of electronic circuitry 122 can be formed from any suitable material or technique such as solder, welds, etc.

In accordance with further embodiments, the multiple connections between the electronic circuitry 122 and the multiple leads 120 provide connectivity (i.e., an electrically and thermally conductive pathway) between circuit nodes 125 on the electronic circuitry 122 and pads disposed on a planar surface 124 (e.g., surface 124-1, surface 124-2 such as a layer of metal, etc.) of the electronic circuit package 110. For example, when the electronic circuit package 110 is connected to the substrate 105, lead 120-1 provides an electrically and thermally conductive pathway between node 125-1 and pad 108-1; lead 120-2 provides an electrically and thermally conductive pathway between node 125-2 of electronic circuitry 122 and pad 108-3; and so on.

Additionally, the connection between facing 128-2 or surface 124-2 of the electronic circuitry 122 and the pad 108-2 provides a thermally conductive pathway (and possibly an electrically conductive pathway as well) between the electronic circuitry 122 and the substrate 105.

In one embodiment, an end (e.g., surface 124) of each of the leads 125 terminates as a surface mount pad on the electronic circuit package 110.

As shown, the cavity 220 formed in leads 120 accommodates placement of the electronic circuitry 122. The leads 120 can be formed from any suitable electrically and thermally conductive mass of material such as metal (e.g., copper, aluminum, combination of materials, etc.).

In accordance with one embodiment as shown, the electronic circuitry 120 resides in the cavity 220 formed by a hollowed volume in the mass of material used to produce leads 120.

Facing 128-2 of the electronic circuitry 122 and electronic circuit package 110 can be substantially planar. By way of a non-limiting example, the surfaces 124 (e.g., planar surfaces) and the facing 128-2 of electronic circuitry 122 can substantially lie in the planar surface. When electronic circuit package 110 is mounted to substrate 105: surface 124-1 contacts pad 108-1; surface 124-2 contacts pad 108-2; surface 124-3 contacts pad 108-3; and so on.

In one embodiment, solder can be used to electrically and thermally connect the respective surfaces 124 to pads 108. Accordingly, both the leads 120 and the facing 128-2 of electronic circuitry 122 provide a pathway to sink heat generated by the electronic circuitry 122 to the substrate 105 during conditions when the electronic circuitry 122 is powered and generating heat.

To facilitate connectivity with respect to the substrate 105, the facing 128-2 or surface 124-2 of the electronic circuitry 122 can substantially align with a planar surface of the electronic circuit package 110. For example, in one embodiment, surfaces 124-1, 124-2, 124-3, etc., reside within the same plane as a bottom surface or facing 128-2 of the electronic circuit package 110.

Figure 2:
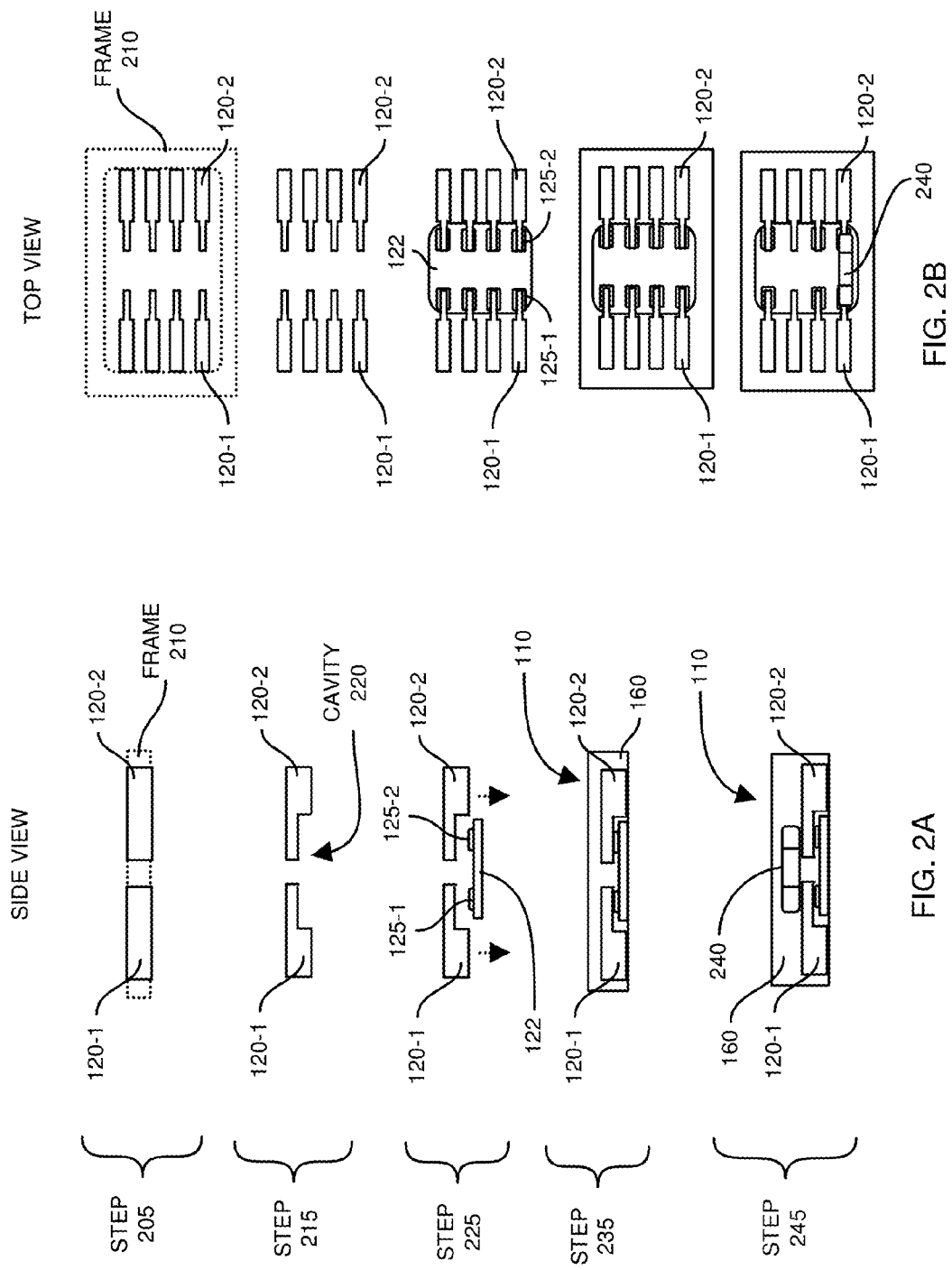
FIG. 2A is an example side view diagram illustrating steps of fabricating an electronic circuit package according to embodiments herein.
FIG. 2B is an example top view diagram illustrating steps of fabricating an electronic circuit package according to embodiments herein.

FIG. 2A is an example side view diagram illustrating steps of fabricating an electronic circuit package according to embodiments herein. FIG. 2B is an example top view diagram illustrating steps of fabricating an electronic circuit package according to embodiments herein.

The electronic circuit package assembler as discussed below can any implement any number of one or more different types of processes to fabricate the electronic circuit package 110.

As shown, in step 205, the electronic circuit package assembler receives a frame 210 including lead material.

The lead material in frame 210 can include multiple leads 120 (e.g., metal leads in raw form) attached to the frame 210. In one embodiment, the leads 120 point axially inward with respect to the frame 210 as shown. Although the leads and frame may be bendable, the frame 210 holds the leads (e.g., lead material) 120 in a predetermined positioned.

In step 215, in one embodiment, the assembler removes a portion of the lead material from leads 120 to form cavity 220. The material can be removed via any suitable method such as etching, grinding, etc.

In step 225, the assembler aligns axial ends of the leads 120 to the nodes 125 disposed on the electronic circuitry 122. The assembler inserts or installs the electronic circuitry 122 into the cavity 220 (e.g., hollowed volume) produced by the removal of material from the lead frame and/or leads 120.

For each respective lead 120, the assembler then solders the axial end of a respective lead to a corresponding node on the electronic circuitry 122.

In step 235, the assembler encapsulates (e.g., via a process such as injection moulding) a combination of the leads 120 and the electronic circuitry 122 with a suitable insulative material.

In accordance with further embodiments, in any suitable step, the assembler removes (e.g., via a method such as grinding, etching, etc.) the frame 210 such that the leads 120 become electrically independent or isolated from each other. The material 160 is at least semiconductor-rigid to prevent the leads from moving.

Accordingly, embodiments herein include removing a frame portion of the lead frame holding the multiple leads in place and encapsulating an assembly including the electronic circuitry 122 and the multiple leads 120 with insulative material to create an electronic circuit package 110.

Note that step 225 can optionally include mounting a discrete electrical component 240 (e.g., a resistor, capacitor, inductor, etc.) across leads 120-1 and 120-2 before encapsulating with material 160. In such an instance, the assembler produces the version of electronic circuit package 110 as shown in step 245. Accordingly, one embodiment herein includes connecting an electronic circuit component 240 to axial ends of at least two leads of the multiple leads 120 in the electronic circuit package 110, the axial ends of the at least two leads (e.g., lead 120-1 and lead 120-2) being disposed between the electronic circuitry 122 and the electronic circuitry 122. The discrete electronic component 240 can be configured to electrically connect axial ends of at least two leads 120-1 and 120-2 as shown, the axial ends of the at least two leads can be disposed between the electronic circuitry and the electronic circuit component.

Figure 3:
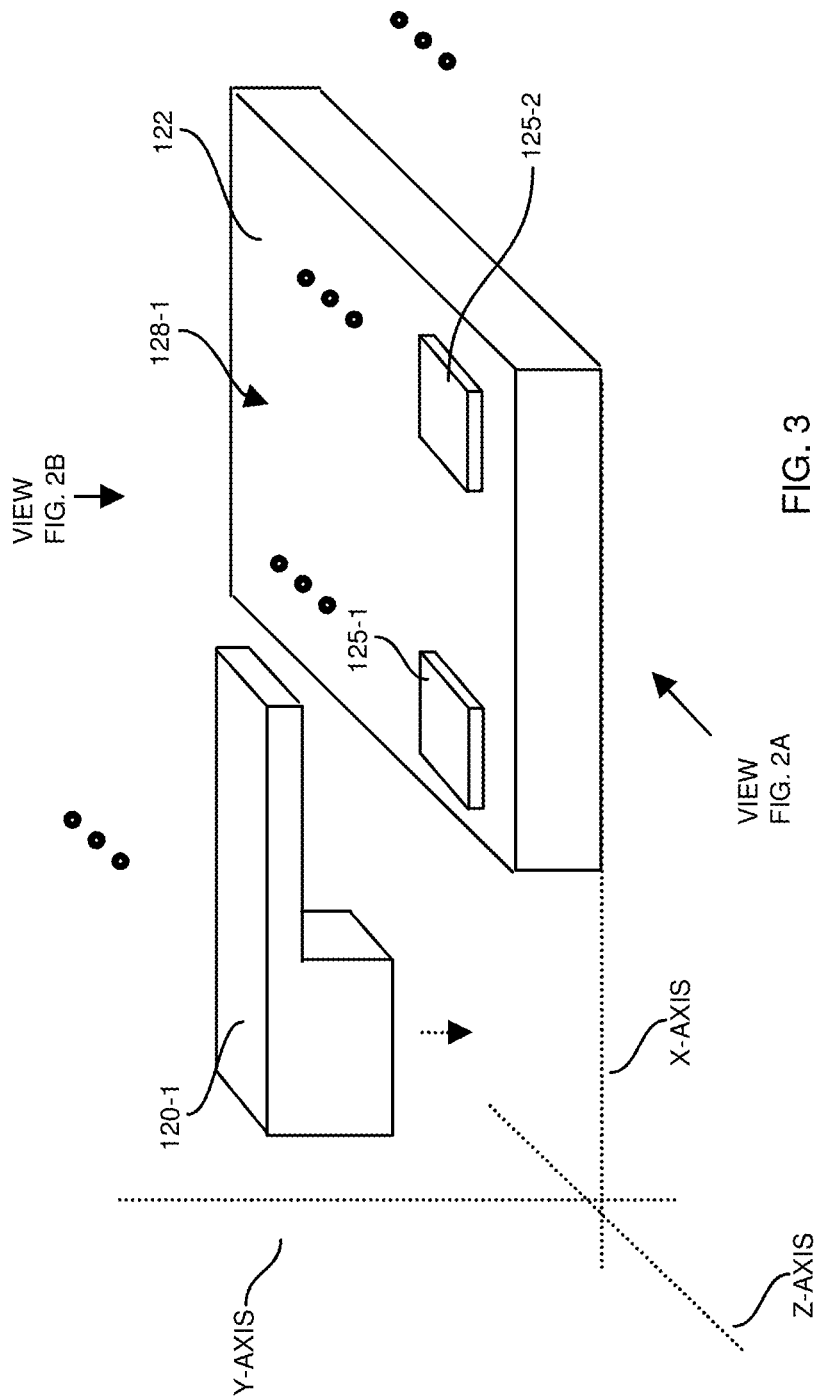
FIG. 3 is an example perspective view diagram illustrating a lead being attached to a node of an electronic circuit according to embodiments herein.

FIG. 3 is an example perspective view diagram illustrating a lead being attached to a node of an electronic circuit according to embodiments herein.

As shown, the assembler positions and aligns leads 120 with respect to nodes 125 and causes each respective lead 120 to make contact with a corresponding node on the electronic circuitry 122. Each of the nodes 125 can include a solder bump. Thereafter, the assembler applies heat to solder the leads 120 to the nodes 125 as previously discussed.

Also, note that the axial end of each lead (e.g., where the lead couples with a respective node 125) can be tapered in a manner as shown and previously discussed with respect to other figures herein.

Figure 4:
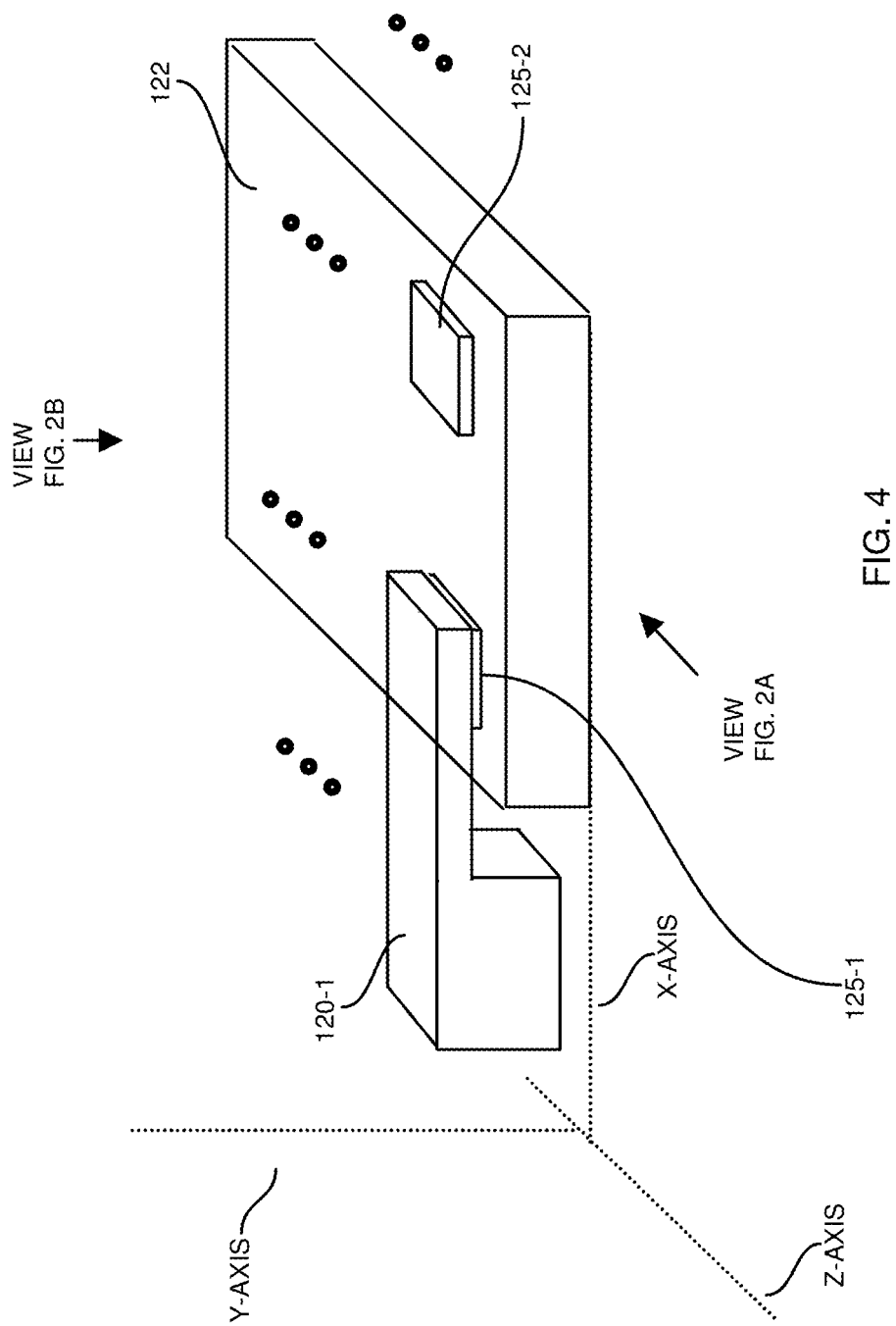
FIG. 4 is an example perspective view diagram a lead coupled to a node on an electronic circuit according to embodiments herein.

FIG. 4 is an example perspective view diagram illustrating a lead coupled to respective nodes on an electronic circuit subsequent to soldering according to embodiments herein. As mentioned above, an assembler injects a material such as plastic to encapsulate the electronic circuitry 122 and leads 120.

Figure 5:
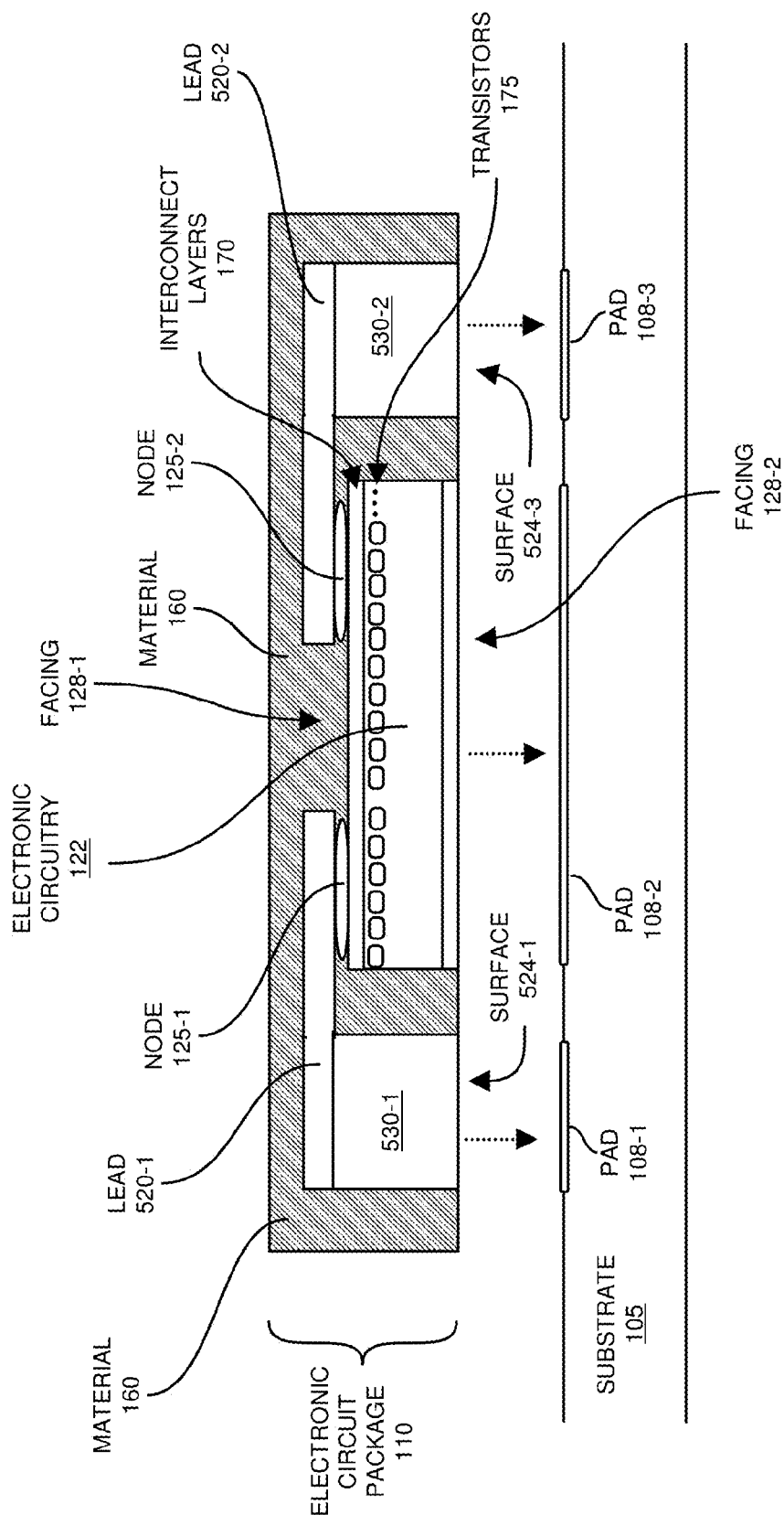
FIG. 5 is an example side view diagram of an electronic circuit package according to embodiments herein.

FIG. 5 is an example side view diagram of an electronic circuit package according to embodiments herein.

This example embodiment is similar to the embodiment as discussed above with respect to FIG. 1. However, the version of the electronic circuit package 110 in FIG. 5 includes leads that are fabricated from multiple components. For example, the combination of lead 520-1 and the conductive element 530-1 provides the same functionality as previously discussed with respect to lead 120-1; the combination of lead 520-2 and the conductive element 530-2 provides the same functionality as previously discussed with respect to lead 120-2; and so on.

In a similar manner as previously discussed, the set of conductive elements 530 and the set of planar leads 520 form a cavity in which the electronic circuitry 122 resides.

As shown, pairings of a conductive element 530 and a corresponding lead 520 (e.g., a planar-surfaced lead) in the electronic circuit package 110 can be configured to form a substantially L-shaped conductive path from a node 125 of the electronic circuitry 122 to a pad or surface 524 of the electronic circuit package 110. As mentioned, the electronic circuitry 122 can reside in a hollowed volume of the substantially L-shaped conductive paths (e.g., from a side view) formed by the conductive elements 530 and the leads 520.

In this example embodiment, the electronic circuitry 122 (e.g., semiconductor device) has a substantially planar surface facing in a first direction (e.g., upwards). The substantially planar surface of the electronic circuitry 122 includes multiple circuit nodes 125. A set of conductive elements 530 is disposed adjacent to the electronic circuitry 122. Set of leads 520 (e.g., at least partially planar leads) electrically couple the multiple circuit nodes 125 on the electronic circuitry 122 to planar surfaces of the conductive elements 122.

When the electronic circuit package 110 is mounted on the substrate 105, the node 125-1 of the electronic circuitry 122 is electrically coupled to pad 108-1 via the electrical path through lead 520-1 and conductive element 530-1; the node 125-2 of the electronic circuitry 122 is electrically coupled to pad 108-3 via the electrical path (and thermal path) through lead 520-2 and conductive element 530-2.

Each of the conductive elements 530 can include one or more planar surfaces. For example, surfaces 524 (e.g., surface 524-1, surface 524-2, etc.) can be planar surfaces residing on the bottom planar facing of the electronic circuit package 110. Opposite each respective surface 524, the conductive element 530 includes another planar surface in which to provide connectivity with respect to a corresponding lead 520 as shown.

Each respective connection between a planar-surfaced lead 520 and a respective conductive element 530 thus provides an electrically and thermally conductive path from a node 125 on the electronic circuitry 122 (e.g., semiconductor device) to a pad (e.g., surface 524) disposed on a mounting surface of the electronic circuit package 110.

In accordance with such an embodiment, the surfaces 524 of the conductive elements form pads on the electronic circuit package 110, the surfaces 524 of the pads face a first direction (e.g., downwards). The surface of the electronic circuit package including the nodes 125 faces a second direction (e.g., upwards), the second direction being substantially opposite the first direction.

In one embodiment, an assembler utilizes surfaces 524 of the conductive elements 530 to form pads on a surface of the electronic circuit package 110. The bottom surface of the electronic circuit package 110 includes surfaces 524, which face a substantially opposite direction than a facing of the planar surface of the electronic circuitry 122 on which the circuit nodes 125 reside.

As previously discussed, the electronic circuitry 122 can be a so-called bump die (e.g., semiconductor chip) including solder bumps.

Figure 6:
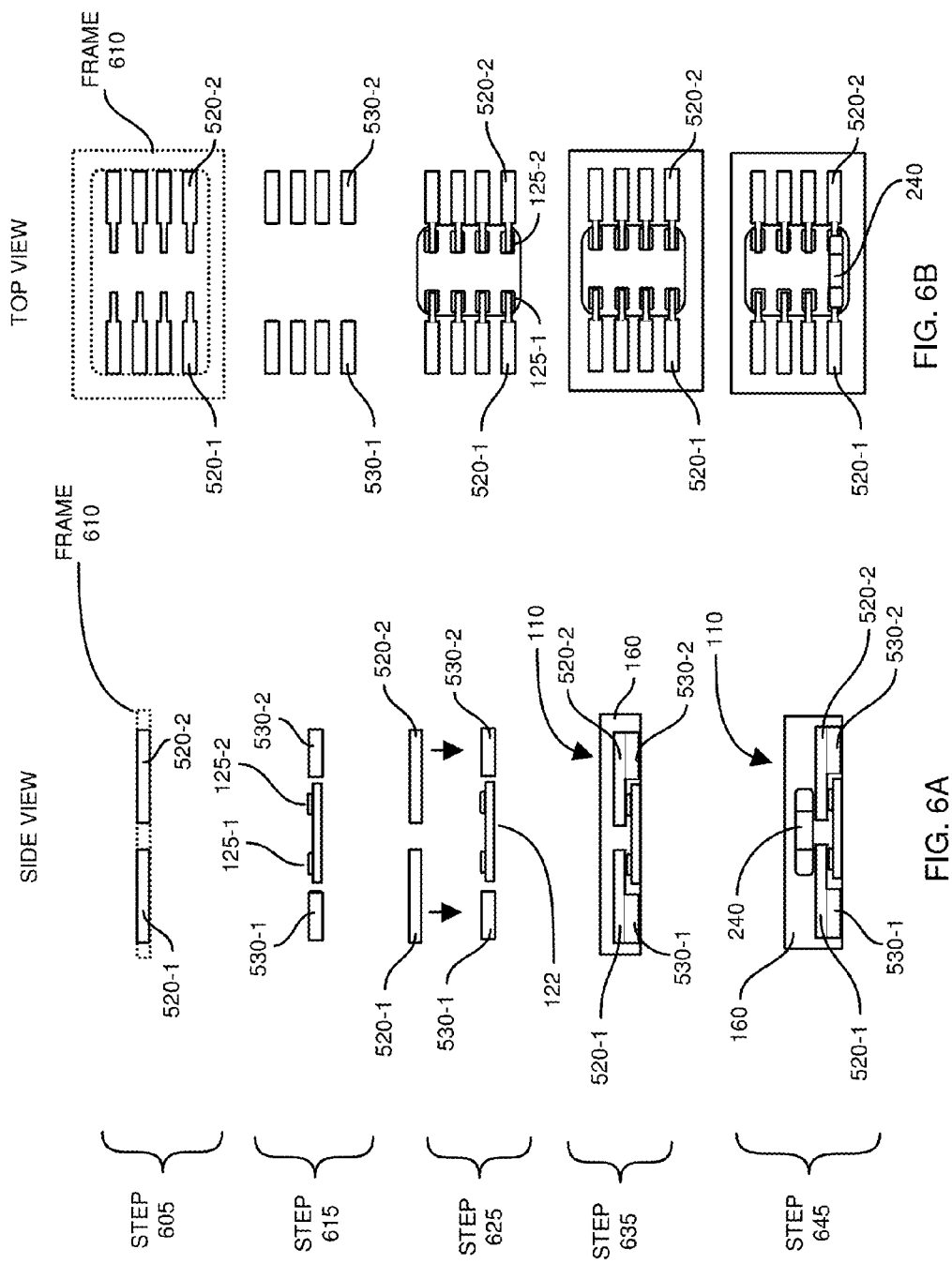
FIG. 6A is an example side view diagram illustrating steps of fabricating an electronic circuit package according to embodiments herein.
FIG. 6B is an example top view diagram illustrating steps of fabricating an electronic circuit package according to embodiments herein.

FIG. 6A is an example side view diagram illustrating steps of fabricating an electronic circuit package according to embodiments herein. FIG. 6B is an example top view diagram illustrating steps of fabricating an electronic circuit package according to embodiments herein.

The electronic circuit package assembler as discussed below can any implement any number of one or more different types of processes to fabricate the electronic circuit package 110.

As shown, in step 605, the electronic circuit package assembler receives a frame 610 to which multiple leads 520 (e.g., metal leads) are attached. In one embodiment, the leads 520 point axially inward with respect to the frame 510 as shown. The frame 510 holds the leads 520 in a predetermined positioned.

In step 615, the assembler receives conductive elements 530. The assembler disposes the conductive elements (e.g., conductive element 530-1, 530-2, etc.) to be adjacent to the electronic circuitry 122. In one embodiment, the assembler disposes the set of conductive elements 530 at a periphery with respect to the electronic circuitry 122. The bottom planar surfaces of the conductive elements and a bottom surface of the electronic circuitry 122 can be disposed in the same plane.

In step 625, the assembler aligns axial ends of the leads 520 to the nodes 125 disposed on the electronic circuitry 122 and the surfaces of the conductive elements 530. For each respective lead 520, the assembler then applies heat to: solder a first axial end of a respective lead 520 to a corresponding conductive element 530 as well as solder a second axial end (e.g., opposite the first axial end) of the respective lead 520 to a corresponding node on the electronic circuitry 122. For example, the assembler forms an electrically conductive connection (e.g., solder bond) between a first end of lead 520-1 to conductive element 530-1; the assembler forms an electrically conductive connection (e.g., solder bond) between a second end of lead 520-1 to node 125-1; the assembler forms an electrically conductive connection (e.g., solder bond) between a first end of lead 520-2 to conductive element 530-2; the assembler forms an electrically conductive connection (e.g., solder bond) between a second end of lead 520-2 to node 125-2; and so on.

In step 635, the assembler encapsulates (e.g., via a process such as injection moulding) a combination of the leads 520, conductive elements 530, and the electronic circuitry 122 within a suitable insulative material.

The frame 610 can be removed at any suitable step in the fabrication process.

In accordance with one embodiment, the assembler removes (e.g., via a method such as grinding, etching, etc.) the frame 610 such that the leads 520 become electrically independent or isolated from each other. The frame 610 may initially couple the leads 520 together. In one embodiment, the material 160 is at least semi-rigid to prevent the leads from moving after being encapsulated.

Note that step 625 can optionally include mounting a discrete electrical component 240 (e.g., a resistor, capacitor, inductor, etc.) across leads 520-1 and 520-2. In such an instance, the assembler produces the version of electronic circuit package 110 as shown in step 645.

Figure 7:
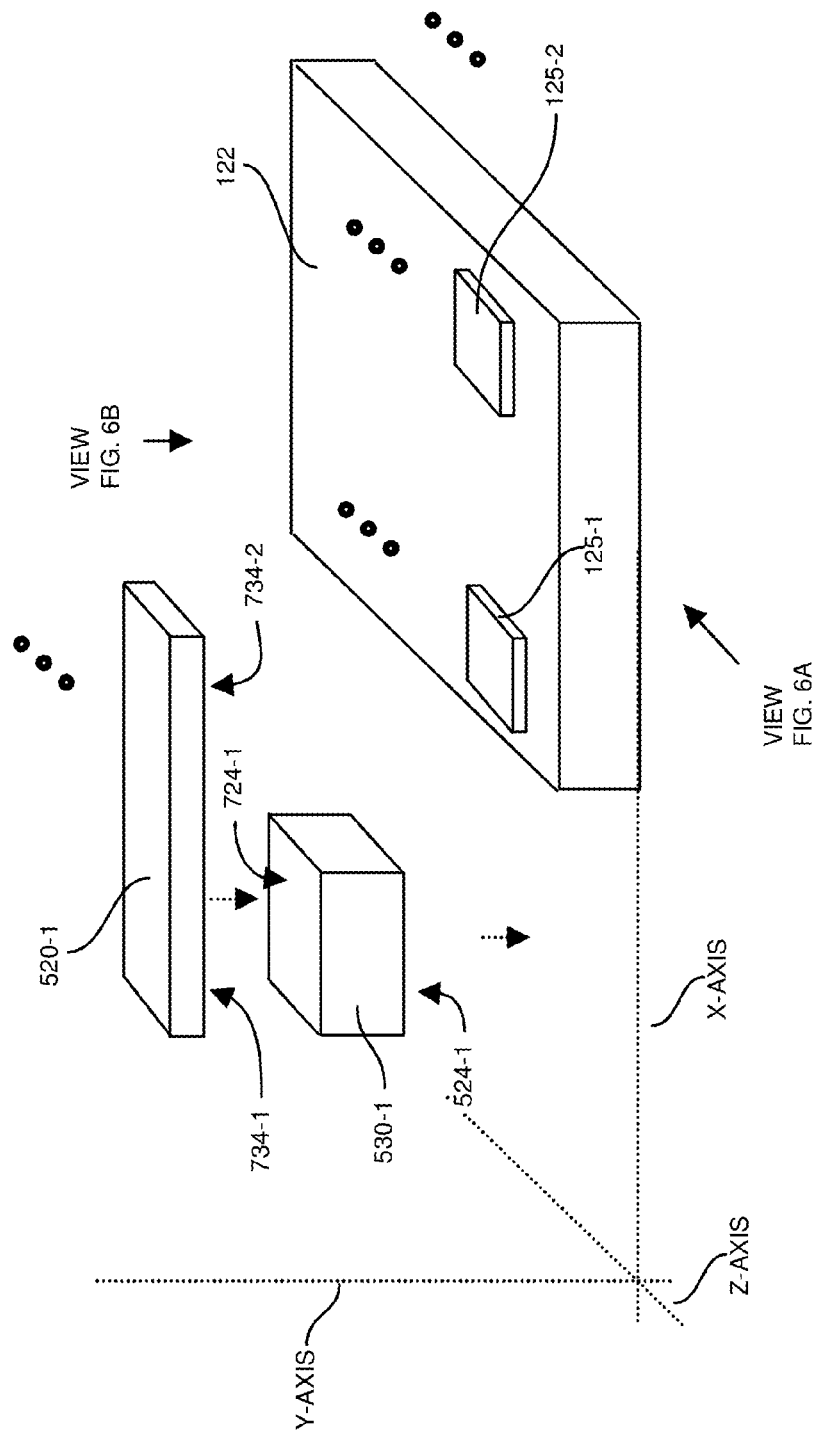
FIG. 7 is an example perspective view diagram illustrating components providing connectivity in an electronic circuit package according to embodiments herein.

FIG. 7 is an example perspective view diagram illustrating a lead being attached to a conductive element and a node of an electronic circuit according to embodiments herein.

As shown, during assembly, the assembler produces the electronic circuit package 110 as previously discussed. For example, the assembler positions conductive element 530-1 to be adjacent with respect to the electronic circuitry 122. The assembler further aligns the lead 520-1 as shown with respect to conductive element 530-1 and the node 125-1 to provide an electrically and thermally conductive bridge between the conductive element 530-1 and the node 125-1.

In one embodiment, the assembler produces a connection between surface 724-1 of conductive element 530-1 and surface 734-1 of lead 520-1 as well as a connection between surface 734-2 of lead 520-1 and node 125-1.

Figure 8:
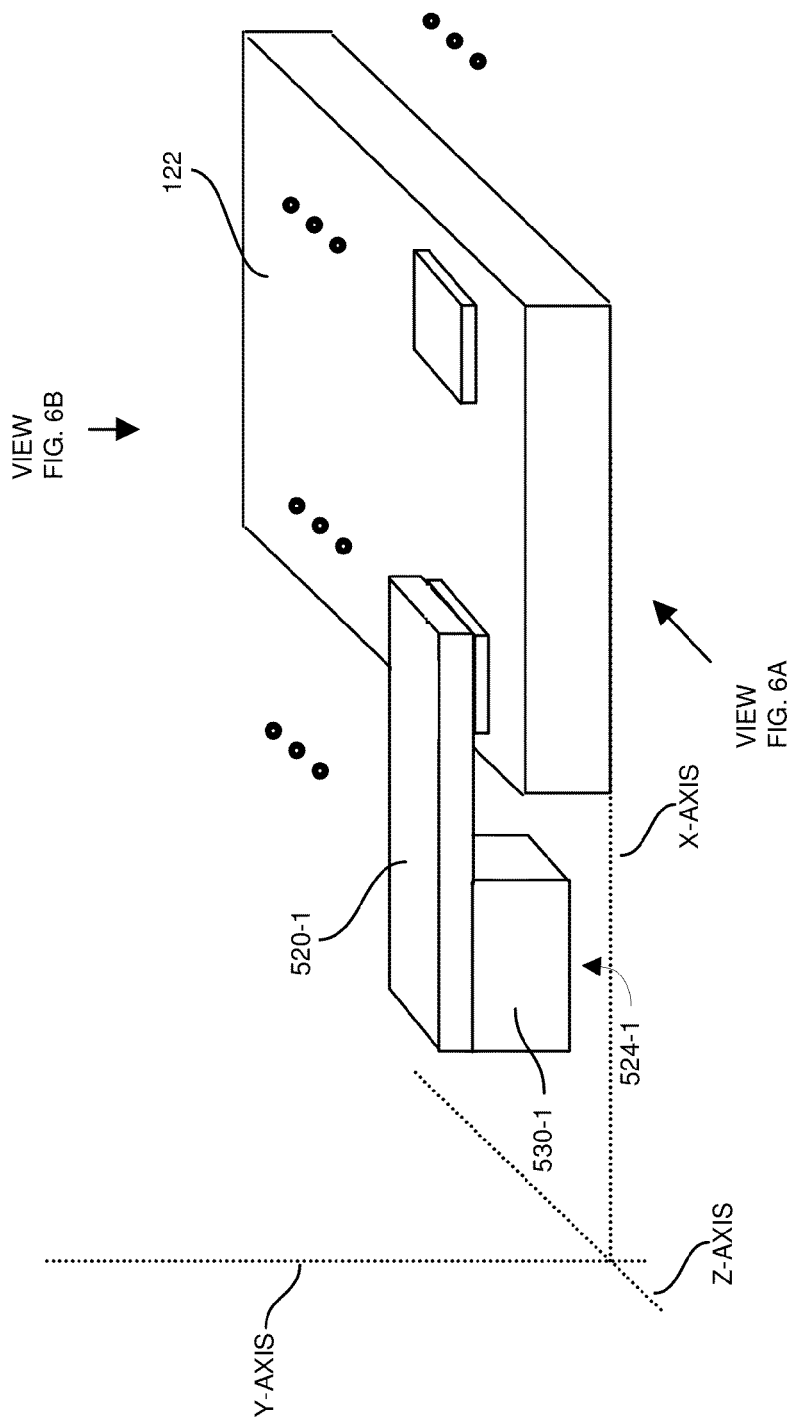
FIG. 8 is an example perspective view diagram illustrating a lead coupled to a node on electronic circuitry according to embodiments herein.

FIG. 8 is an example perspective view diagram illustrating a lead coupled to respective nodes on an electronic circuit subsequent to soldering according to embodiments herein.

As mentioned above, subsequent to making connections as discussed above, the assembler then injects a material such as plastic to encapsulate the electronic circuitry 122 and leads 120. As mentioned, each of the two-part leads between a node of the electronic circuitry 122 and a pad of the electronic circuit package 110 can include a conductive element 530 as well as a lead 520.

Figure 9:
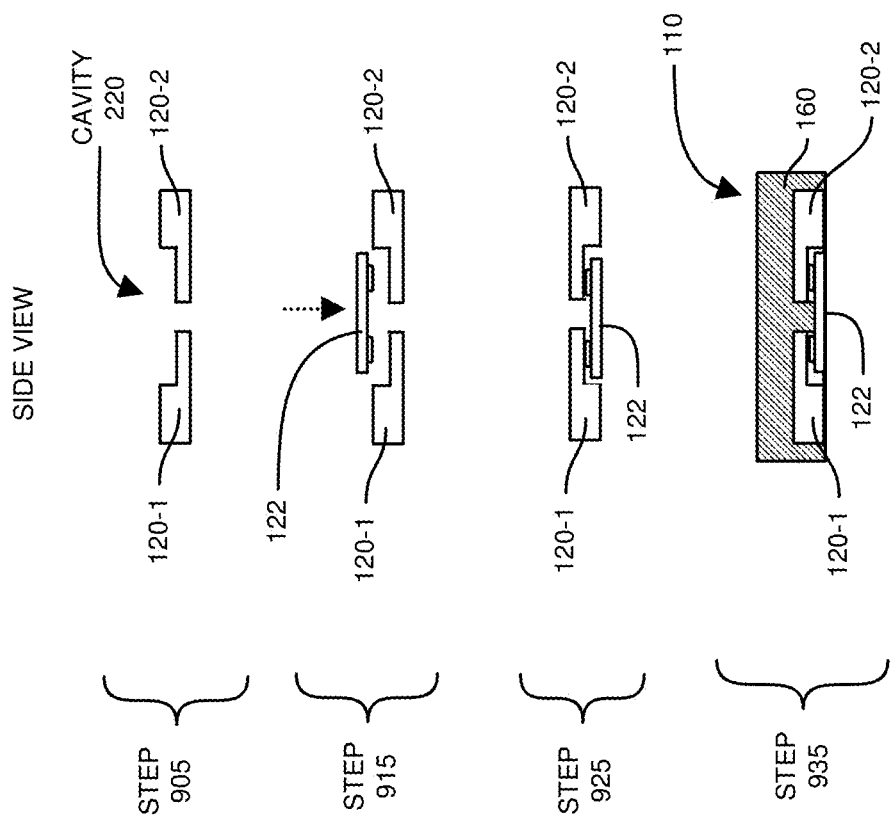
FIG. 9 is an example side view diagram illustrating steps of fabricating an electronic circuit package according to embodiments herein.

FIG. 9 is an example side view diagram illustrating steps of fabricating an electronic circuit package according to embodiments herein.

In step 905, the assembler produces cavity 220 in a manner as previously discussed.

In step 915, the assembler couples the leads 120 to nodes 125 of electronic circuitry in a manner as previously discussed.

In step 925, the assembler flips the assembly including the leads 120 and the electronic circuitry 122.

In step 935, the assembler encapsulates the assembly with material 160 to produce electronic circuit package 110.

Figure 10:
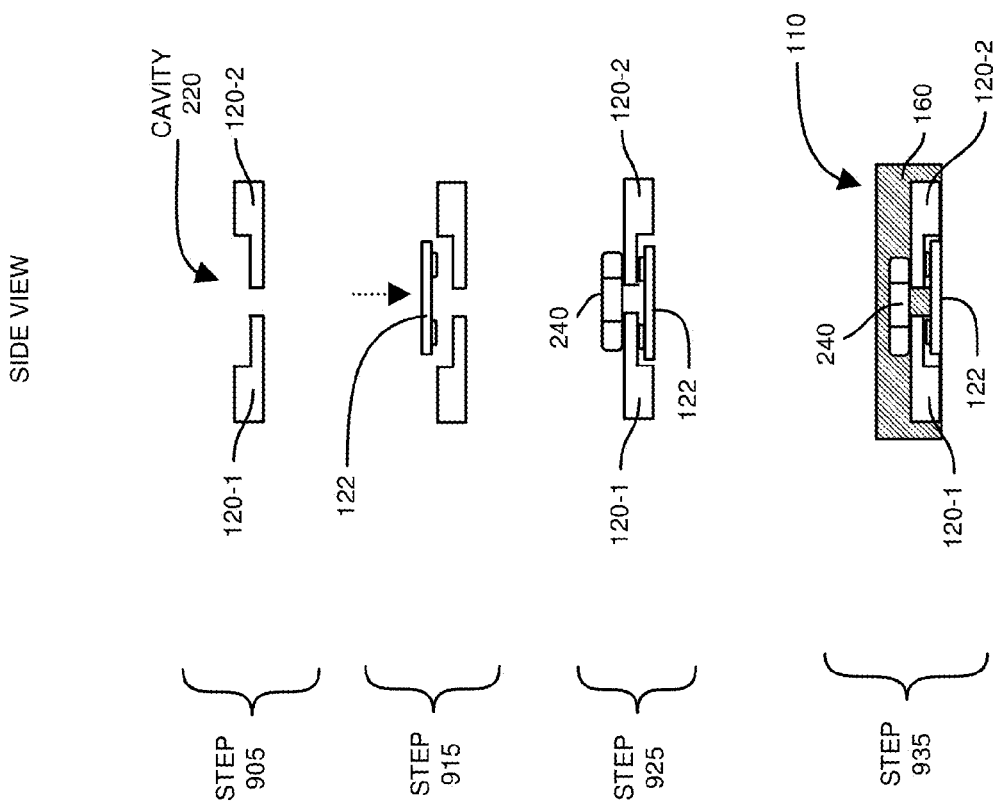
FIG. 10 is an example side view diagram illustrating steps of fabricating an electronic circuit package according to embodiments herein.

FIG. 10 is an example side view diagram illustrating steps of fabricating an electronic circuit package according to embodiments herein.

In step 1005, the assembler produces cavity 220 in leads 120.

In step 1015, the assembler couples nodes 125 of the electronic circuitry 122 to the leads 120.

In step 1025, the assembler couples the circuit component 240 across the leads 120 opposite the electronic circuitry 122.

In step 1035, the assembler injects the material 160 to produce the electronic circuit package 110.

Figure 11:
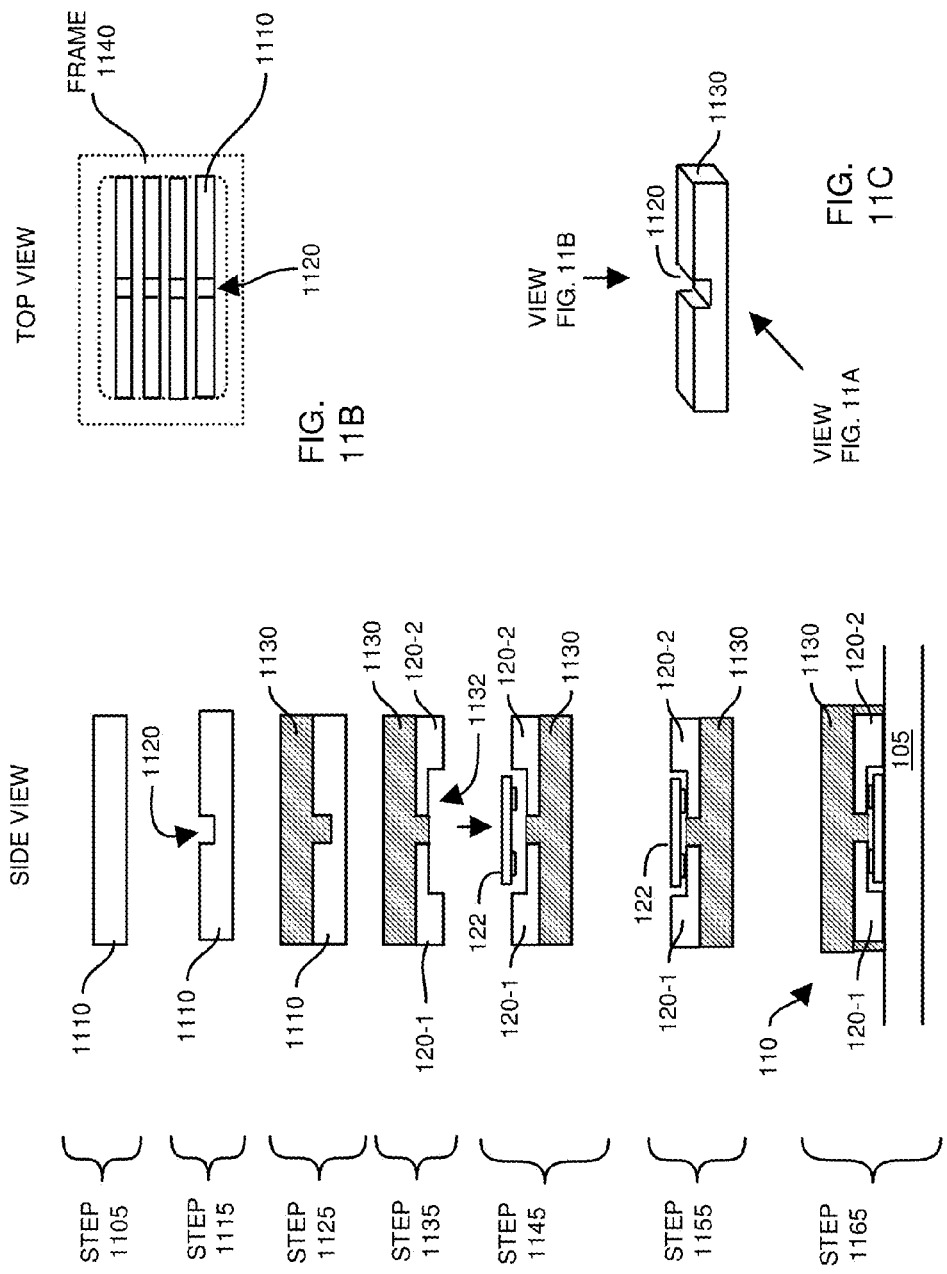
FIG. 11A is an example side view diagram illustrating steps of fabricating an electronic circuit package according to embodiments herein.
FIG. 11B is an example top view diagram illustrating a lead frame including one or more lengths of conductive material according to embodiments herein.
FIG. 11C is an example perspective view diagram illustrating a length of conductive material including a notch according to embodiments herein.

FIG. 11A is an example side view diagram illustrating steps of fabricating an electronic circuit package according to embodiments herein.

In step 1105, the assembler receives frame 1140. The frame can include one or more lengths of conductive material 1110.

In step 1115, the assembler removes a portion of material to produce a respective notch 1120 in each of the one or more lengths of conductive material 1110.

In step 1125, the assembler applies material 1130 to a surface of the lengths of conductive material 1110. Application of the layer of insulative material 1130 to the surface of the lengths of conductive material 1110 can include filling at least a portion of the respective notches 1120 with the insulative material 1130.

In step 1135, the assembler removes material from the lengths of conductive material 1110 to produce cavity 1132 and leads 120. Removing the portion of material from the lengths of conductive material 1110 can include creating a cavity 1132 in the lengths of conductive material 1110 opposite the layer of insulative material 1130.

In one embodiment, removal of the material from the mass of conductive material (e.g., a respective length of conductive material 1110) also produces multiple electrically isolated leads 120 in which to attach nodes 125 on the electronic circuitry 122 to the pads disposed on the planar surface of the electronic circuit package 110.

In step 1145, in a manner as previously discussed, installs the electronic circuitry 122 in the cavity 1132. The assembler aligns and couples nodes 125 of the electronic circuitry 122 to corresponding leads 120 as shown.

In step 1155, the assembler solders nodes 125 of the electronic circuitry 122 to corresponding leads 120.

In step 1165, the assembler encapsulates the assembly to produce electronic circuit package 110 for mounting on a respective substrate 105.

Note that the frame 1140 can be removed at any suitable step in the above process such as in step 1125.

FIG. 11B is an example top view diagram illustrating a lead frame 1140 including multiple lengths of conductive material 1120 according to embodiments herein.

FIG. 11C is an example perspective view diagram illustrating a length of conductive material 1110 including a notch 1120 according to embodiments herein.

Figure 12:
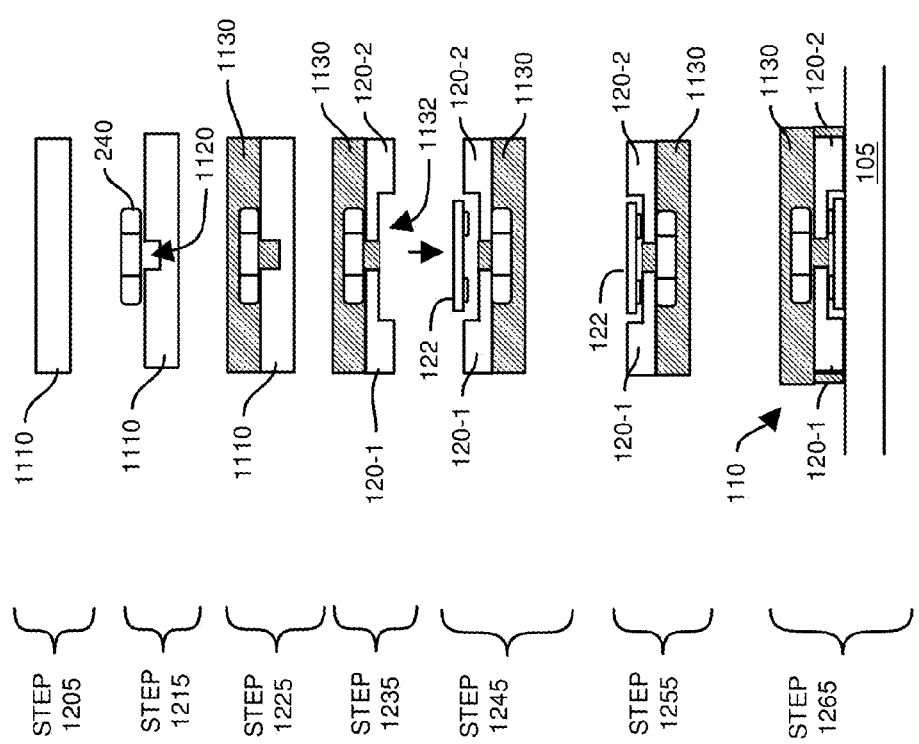
FIG. 12 is an example side view diagram illustrating fabrication of an electronic circuit package according to embodiments herein.

FIG. 12 is an example side view diagram illustrating fabrication of an electronic circuit package according to embodiments herein.

In step 1205, the assembler receives one or more lengths of conductive material 1110. The length of conductive material 1110 can be one of multiple lengths of conductive material that is processed in a similar manner.

In step 1215, the assembler produces notch 1120. The assembler electrically couples the component 240 across the notch 1120 such that one axial end of the component 240 is connected to the length of conductive material 1110 at one side of the notch 1120; the other axial end of the component 240 is connected to the length of conductive material 1110 at an opposite side of the notch 1120 as shown.

In step 1225, the assembler applies a coating of material 1130 as shown to a surface of the length of conductive material 1110.

In step 1235, the assembler produces cavity 1132.

In step 1245, in a manner as previously discussed, the assembler installs the electronic circuitry 122 in the cavity 1132. The assembler aligns and couples nodes 125 of the electronic circuitry 122 to the leads 120 as shown.

In step 1255, the assembler solders nodes 125 of the electronic circuitry 122 to corresponding leads 120.

In step 1265, the assembler encapsulates the assembly to produce electronic circuit package 110 for mounting on a respective substrate 105.

Figure 13:
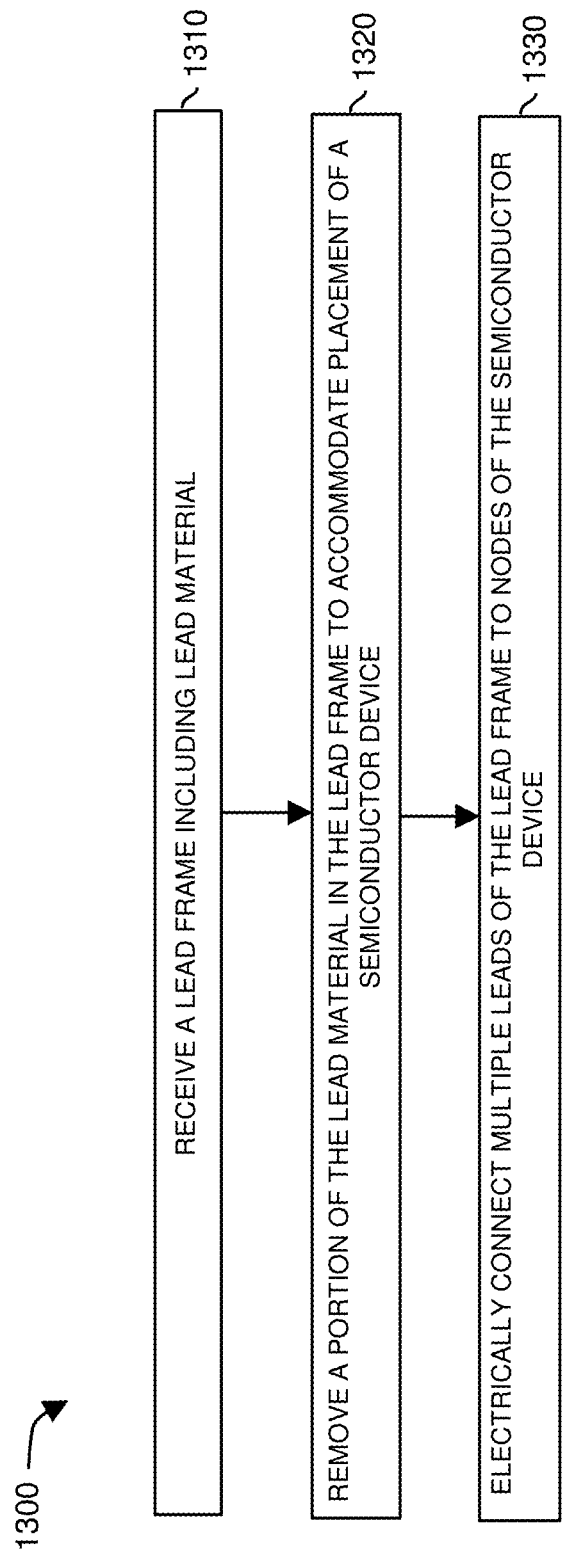
FIGS. 13-15 are flowcharts illustrating example methods according to embodiments herein.
Figure 14:
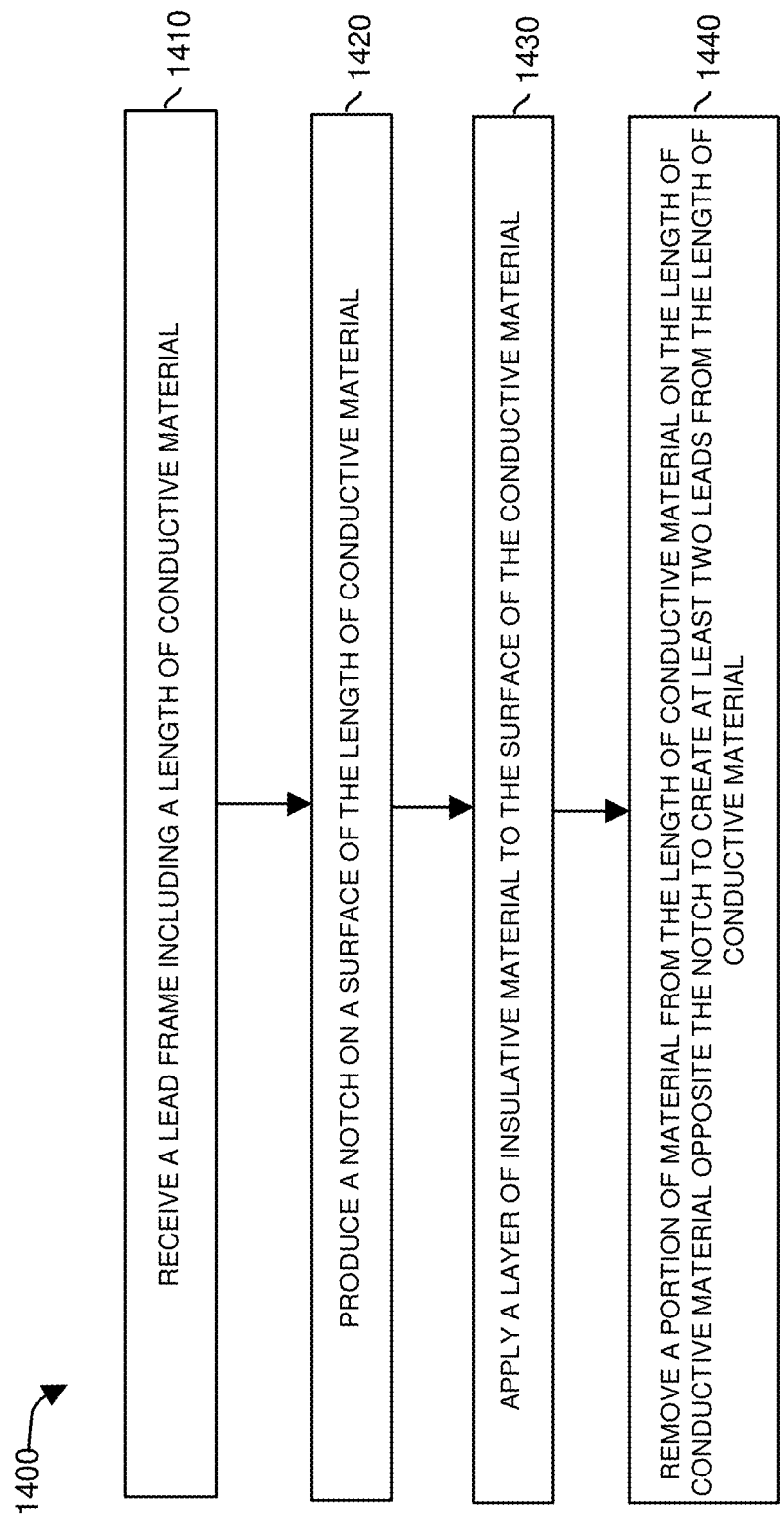
Figure 15:
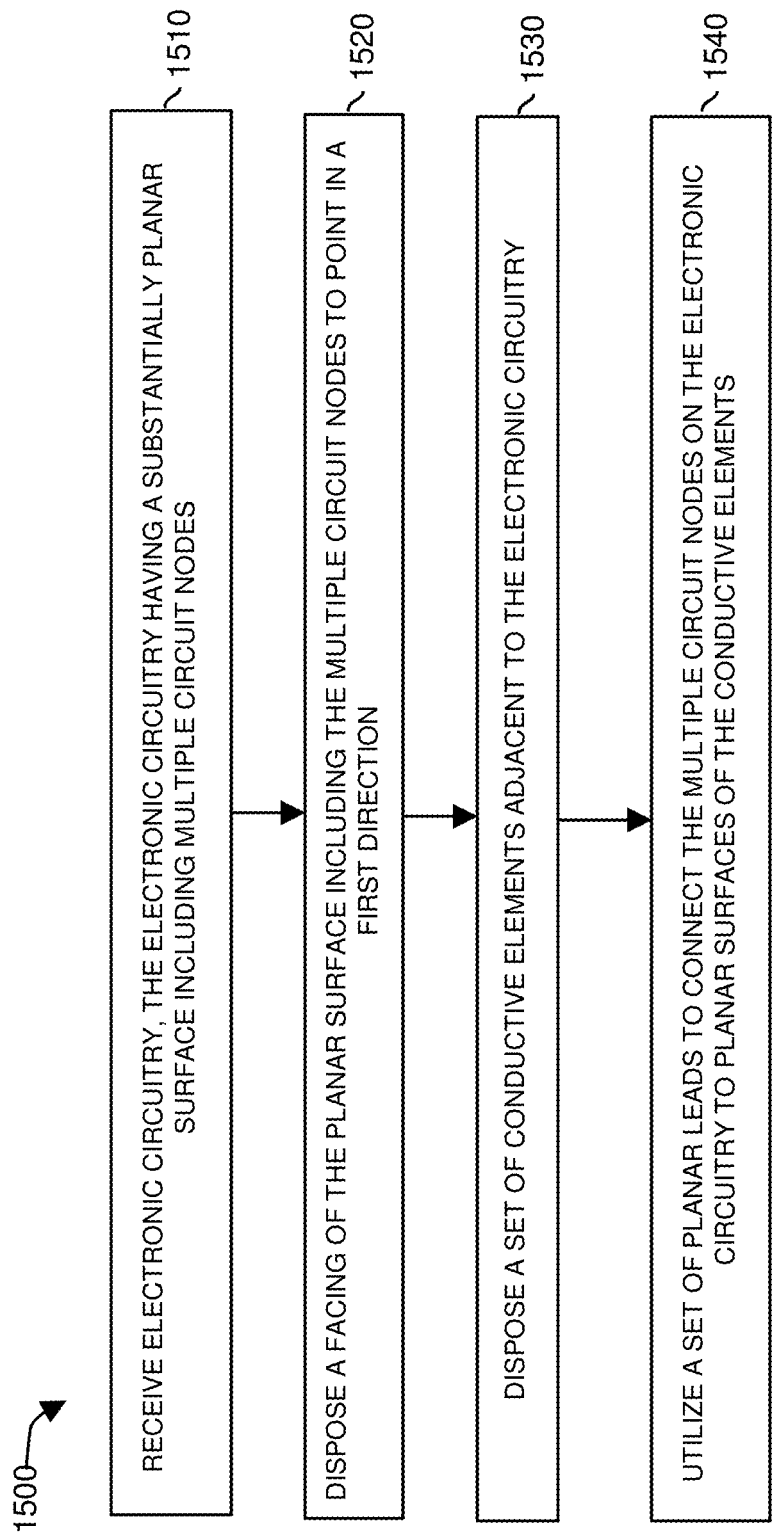

FIGS. 13-15 are flowcharts illustrating example methods according to embodiments herein.

FIG. 13 is a flowchart 1300 illustrating an example method of fabricating an electronic circuit package according to embodiments herein. Note that there will be some overlap with respect to concepts as discussed above. Also, the steps can be executed in any suitable order.

In step 1310, the electronic circuit package fabricator receives a lead frame 210 including lead material.

In step 1320, the electronic circuit package fabricator removes a portion of the lead material in the lead frame 210 to create leads 120 and to accommodate placement of electronic circuitry 122 (e.g., a semiconductor device).

In step 1330, the electronic circuit package fabricator electrically connects multiple leads 120 of the lead frame 210 to nodes of the electronic circuitry 122.

FIG. 14 is a flowchart 1400 illustrating an example method of fabricating an electronic circuit package according to embodiments herein. Note that there will be some overlap with respect to concepts as discussed above. Also, the steps can be executed in any suitable order.

In step 1410, the electronic circuit package fabricator receives a lead frame 610 including at least one length of conductive material 1110.

In step 1420, the electronic circuit package fabricator produces a notch 1120 on a top surface of the length of conductive material 1110.

In step 1430, the electronic circuit package fabricator applies a layer of insulative material 1130 to the surface of the conductive material.

In step 1440, the electronic circuit package fabricator removes a portion of material from the length of conductive material 1110 opposite the notch 1120 to create at least two leads 120-1 and 120-2 from the length of conductive material 1110.

FIG. 15 is a flowchart 1500 illustrating an example method of fabricating an electronic circuit package according to embodiments herein. Note that there will be some overlap with respect to concepts as discussed above. Also, the steps can be executed in any suitable order.

In step 1510, the electronic circuit package fabricator receives electronic circuitry 122. The electronic circuitry 122 has a substantially planar surface including multiple circuit nodes 125.

In step 1520, the electronic circuit package fabricator disposes a facing 128-1 of the planar surface of electronic circuitry 122 including the multiple circuit nodes 125 to point in a first direction In step 1530, the electronic circuit package fabricator disposes a set of conductive elements 530 adjacent to the electronic circuitry 122.

In step 1540, the electronic circuit package fabricator utilizes a set of planar leads (e.g., leads 520) to connect the multiple circuit nodes 125 on the electronic circuitry 122 to planar surfaces (e.g., surfaces 724) of the conductive elements 530.

Figure 16:
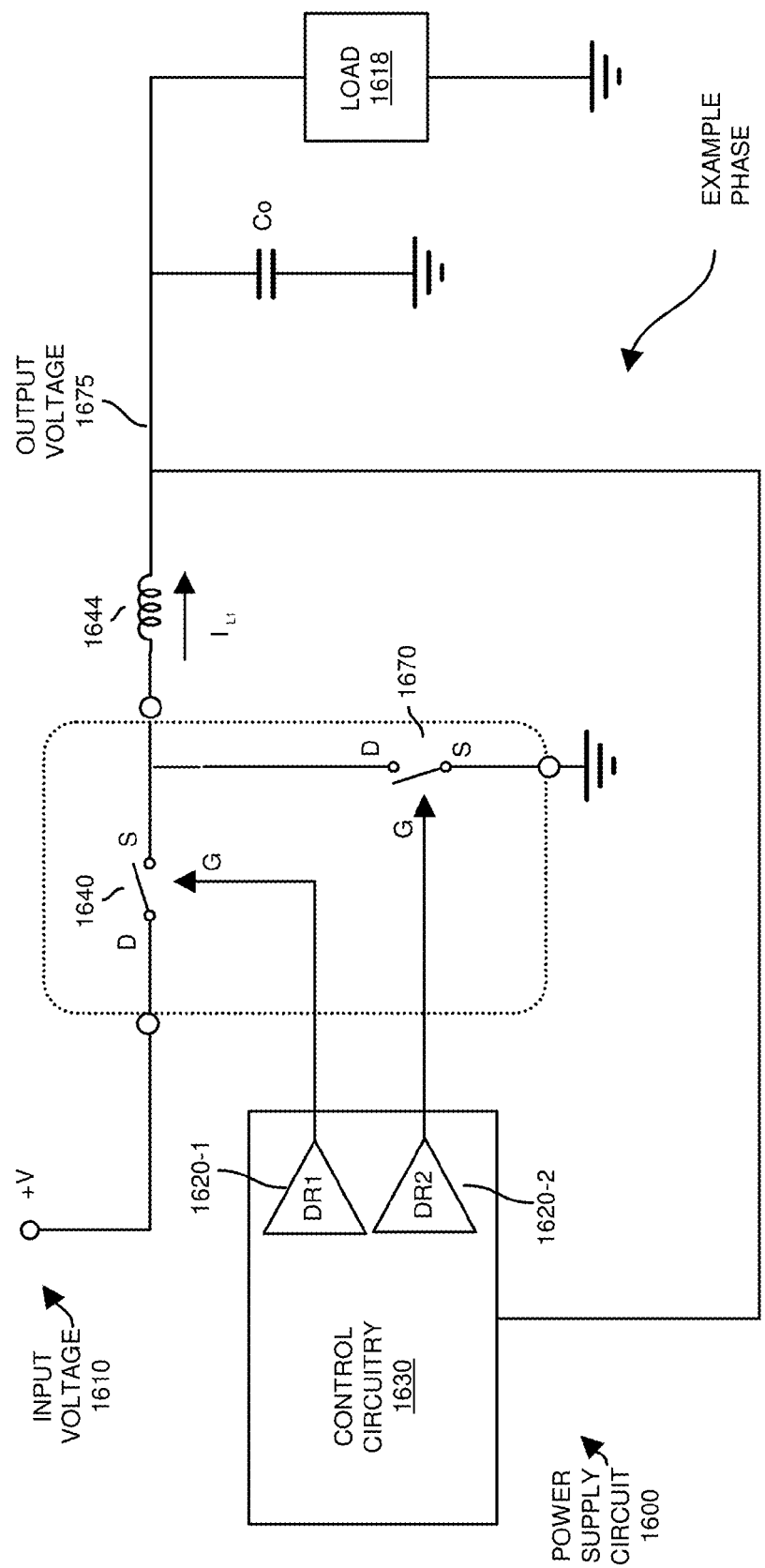
FIG. 16 is an example diagram illustrating a power supply circuit according to embodiments herein.

FIG. 16 is an example diagram illustrating a power supply circuit according to embodiments herein. The electronic circuitry 122 can include any portion of or all of the electronic circuitry shown in FIG. 16.

As shown, power supply circuitry 1600 includes control circuitry 1630, control switch circuitry 1640 (a.k.a., high side switch circuitry), synchronous switch circuitry 1670 (a.k.a., low side switch circuitry), inductor 1644, and load 1618. In general, power supply circuitry 1600 receives and converts input voltage 1610 to output voltage 1675 to power load 1618.

During operation, control circuitry 1630 controls a state of drivers DR1 and DR2. Driver DR1 controls a state of respective control switch circuitry 1640; driver DR2 controls a state of respective synchronous switch circuitry 1670.

In a first portion of a switching control cycle, when control switch circuitry 1640 is turned ON or activated (while synchronous switch circuitry 1670 is OFF or deactivated), a low impedance path is formed between respective source and drain nodes of the control switch circuitry 1640. The amount of current flowing from the input voltage 1610 through the control switch circuitry 1640 and through the inductor 1644 increases. When in an OFF state, little or no current flows through synchronous switch circuitry 1670.

In a second portion of a switching control cycle, when synchronous switch circuitry 1670 is turned ON or activated (while control switch circuitry 1640 is OFF or deactivated), a low impedance path is formed between respective source and drain nodes of the synchronous switch circuitry 1670. The amount of current flowing from ground through the synchronous switch circuitry 1670 and through the inductor 1644 increases. When in an OFF state, little or no current flows through control switch circuitry 1640.

The control circuitry 1630 controls the pulse durations of driving the control switch circuitry 1640 and the synchronous switch circuitry 1670 over multiple switching cycles such that the power supply circuitry 1600 maintains the output voltage 1675 within a desired magnitude range. Note that in this example, the power supply circuitry 1600 includes a single phase. It should be note that the power supply circuitry can be expanded to include any number of phases.

In one embodiment, each of the synchronous switch circuitry 1670 and the control switch circuitry 1640 are field effect transistors including respective gate, source, and drain nodes. The control switch circuitry 1640 and the synchronous switch circuitry 1670 can be fabricated in accordance with different types of technologies. For example, in one embodiment, the control switch circuitry 1640 is fabricated to include a set of parallel transistors in accordance with lateral or planar fabrication technology; the semiconductor chip substrate 1670 is fabricated a set of parallel transistors in accordance with vertical fabrication technology.

The electronic circuit package 110 as discussed herein, such as a surface mount device, can include any portion of or all of the components in power supply circuitry 1600. For example, the electronic circuit package 110 can include the control switch circuitry 1640 and the synchronous switch circuitry 1670.

In accordance with further embodiments, note that the electronic circuit package 110 can include one or more drivers, control circuitry 1630, etc.

Techniques herein are well suited for use in electronic circuit package fabrication and power supply circuitry. However, it should be noted that embodiments herein are not limited to use in such applications and that the techniques discussed herein are well suited for use in other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An electronic circuit package comprising: electronic circuitry; a discrete electronic circuit component; a set of multiple leads forming a cavity to accommodate the electronic circuitry, the leads being electrically conductive, the electronic circuitry residing in the cavity;

multiple connections between the electronic circuitry and the multiple leads, the multiple leads providing connectivity between circuit nodes on the electronic circuitry and pads disposed on a planar surface of the electronic circuit package; and wherein the set of multiple leads has a first exposed facing and a second exposed facing, the second exposed facing being a planar facing, the electronic circuitry residing in the cavity and coupled to the set of multiple leads via the first exposed facing, the discrete electronic circuit component electrically coupled to the multiple leads via the second facing;

the electronic circuit package further comprising: a filled volume of insulative material encapsulating the set of multiple leads and the discrete electronic circuit component, the filled volume disposed above the planar surface to protect the multiple leads and the discrete circuit component, the pads disposed on the planar surface of the electronic circuit package exposed for attachment to a respective host circuit substrate.

2. The electronic circuit package as in claim 1, wherein the circuit nodes are disposed on a planar facing of the electronic circuitry; and wherein the planar facing of the electronic circuitry including the circuit nodes faces a substantially opposite direction than the planar surface of the electronic circuit package.

3. The electronic circuit package as in claim 1, wherein each of the multiple leads extends from a respective node disposed on a surface of the electronic circuitry to a respective pad disposed on a surface of the electronic circuit package, the surface of the electronic circuitry facing a substantially opposite direction than the pads on the planar surface of the electronic circuit package.

4. The electronic circuit package as in claim 1, wherein each of the multiple leads includes a surface area on the first exposed facing to electrically connect a respective lead to a corresponding circuit node on the electronic circuitry, the surface area of each lead facing a substantially same direction as the pads disposed on the planar surface of the electronic circuit package.

5. The electronic circuit package as in claim 1,
wherein a combination of the electronic circuitry, axial ends of the multiple leads, and discrete electronic circuit component forms a stack; and wherein the axial ends of the multiple leads resides in the stack between the electronic circuitry and the discrete electronic circuit component.

6. The electronic circuit package as in claim 1, wherein the pads disposed on the planar surface of the electronic circuit package face a first direction;

wherein the first exposed facing faces the first direction; and wherein the second exposed facing faces a second direction, the second direction being opposite the first direction.

7. The electronic circuit package as in claim 1, wherein the electronic circuitry includes a first facing and a second facing, the first facing of the electronic circuitry disposed substantially opposite the second facing of the electronic circuitry, the first facing of the electronic circuitry facing in contact with the first exposed facing of the set of multiple leads;

wherein the circuit nodes are disposed on the first facing of the electronic circuitry; and wherein the second facing of the electronic circuitry substantially aligns with a planar surface of the electronic circuit package.

8. The electronic circuit package as in claim 1, wherein the discrete electronic circuit component electrically connects axial ends of at least two leads of the multiple leads, the axial ends of the at least two leads sandwiched between the electronic circuitry and the discrete electronic circuit component.

9. The electronic circuit package as in claim 1, wherein the multiple connections includes a first connection and a second connection, the first connection connecting a first node of the electronic circuitry to a first lead in the set, the second connection connecting a second node of the electronic circuitry to a second lead in the set; and the discrete electronic circuit component affixed between an axial end of the first lead and an axial end of the second lead on the second exposed facing, a first node of the discrete electronic circuit component electrically connected to the first lead via a first region on the second exposed facing, a second node of the discrete electronic circuit component electrically coupled to the second lead via a second region on the second exposed facing.

10. The electronic circuit package as in claim 9, wherein the first exposed facing faces a direction opposite the second exposed facing.

11. The electronic circuit package as in claim 10, wherein the axial end of the first lead is a first solid mass of electrically conductive material to which the electronic circuitry is coupled via the first exposed facing and to which the discrete electronic circuit component is coupled via the second exposed facing, the first solid mass of electrically conductive material extending from the axial end of the first lead to a first pad disposed on the planar surface of the electronic circuit package; and wherein the axial end of the second lead is a second solid mass of electrically conductive material to which the electronic circuitry is coupled via the first exposed facing and to which the discrete electronic circuit component is coupled via the second exposed facing, the second solid mass of electrically conductive material extending from the axial end of the second lead to a second pad disposed on the planar surface of the electronic circuit package.

12. The electronic circuit package as in claim 11 further comprising:

insulative material encapsulating a combination of the electronic circuitry, the set of multiple leads, and the discrete electronic circuit component; and wherein the pads are exposed on the planar surface of the electronic circuit package facilitating attachment to a host substrate.

13. The electronic circuit package as in claim 12, wherein a combination of the electronic circuitry, axial ends of the multiple leads, and discrete electronic circuit component forms a stack; and wherein the axial ends of the multiple leads resides in the stack between the electronic circuitry and the discrete electronic circuit component.

14. A method comprising: receiving a lead frame including lead material; removing a portion of the lead material in the lead frame to expose a first facing of multiple leads and accommodate placement and attachment of electronic circuitry;

exposing a second facing of the multiple leads;

via the first exposed facing, electrically connecting the multiple leads to nodes of the electronic circuitry; and via the second exposed facing, and prior to removing the portion of lead material to expose the first facing, electrically connecting a discrete electronic circuit component to the multiple leads.

15. The method as in claim 14 further comprising:

producing each of multiple inward pointing axial ends of the leads to include a planar surface on the second exposed facing; and electrically coupling each planar surface on the second exposed facing to a corresponding node of the discrete electronic circuit component.

16. The method as in claim 14 further comprising:

connecting the discrete electronic circuit component to axial ends of at least two leads of the multiple leads on the second exposed facing, the axial ends of the at least two leads disposed in a vertical stacking between the electronic circuitry and the discrete electronic circuit component, the axial ends pointing towards each other.

17. The method as in claim 16 further comprising:

encapsulating the electronic circuitry, the discrete electronic circuit component, and the multiple leads with insulative material to create an electronic circuit package.

18. The method as in claim 14, wherein the second facing of the lead frame is disposed to face a direction opposite the first facing.

19. The method as in claim 18, further comprising:

encapsulating a combination of the electronic circuitry, discrete electronic circuit component, and the multiple leads with insulative material to create an electronic circuit package.

20. The method as in claim 14, wherein the multiple leads includes a first lead and a second lead;

wherein the portion of lead material in the lead frame connects the first lead to the second lead; and wherein removing the portion of lead material in the lead frame separates the first lead from the second lead.

* * * * *